United States Patent
Huang

(10) Patent No.: US 10,004,137 B2
(45) Date of Patent: Jun. 19, 2018

(54) PRINTED CIRCUIT BOARD ASSEMBLY

(71) Applicant: Silicon Motion, Inc., Jhubei, Hsinchu County (TW)

(72) Inventor: I-Hung Huang, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days. days.

(21) Appl. No.: 15/408,672

(22) Filed: Jan. 18, 2017

(65) Prior Publication Data

US 2017/0280557 A1    Sep. 28, 2017

(30) Foreign Application Priority Data

Mar. 22, 2016 (TW) .............................. 105108770 A

(51) Int. Cl.
| | |
|---|---|
| H05K 1/03 | (2006.01) |
| H05K 1/02 | (2006.01) |
| G01R 1/04 | (2006.01) |
| G01R 31/00 | (2006.01) |
| H05K 1/11 | (2006.01) |

(52) U.S. Cl.
CPC ......... *H05K 1/0271* (2013.01); *G01R 1/0416* (2013.01); *G01R 31/003* (2013.01); *H05K 1/111* (2013.01); *H05K 1/115* (2013.01); *H05K 2201/07* (2013.01)

(58) Field of Classification Search
CPC ...... H05K 1/0271; H05K 1/111; H05K 1/115; H05K 2201/07; G01R 1/0416; G01R 31/003
USPC ........ 174/255, 250, 251, 256–258, 261, 262
See application file for complete search history.

(56) References Cited

U.S. PATENT DOCUMENTS

| | | |
|---|---|---|
| 8,987,901 B2 | 3/2015 | Sasaoka |
| 9,095,071 B2 | 7/2015 | Fukami et al. |
| 2014/0353006 A1 | 12/2014 | Lee |

FOREIGN PATENT DOCUMENTS

| | | |
|---|---|---|
| CN | 102612265 A | 7/2012 |
| TW | 201436689 A | 9/2014 |
| TW | 201446100 A | 12/2014 |

OTHER PUBLICATIONS

Ko, M.C.; "A Study on Competitive Strategies in Matured Industrial Environment: A Case Study on the Printed Circuit Board Industry of Taiwan;" Jan. 2004.
English language translation of cited lines, p. 52.

*Primary Examiner* — Tremesha S Willis
(74) *Attorney, Agent, or Firm* — McClure, Qualey & Rodack, LLP

(57) ABSTRACT

The present invention provides a printed circuit board assembly including a substrate having a plurality of conductive layers vertically sandwiched between a first cap-insulation layer and a second cap-insulation layer. The substrate has a first part, a second part and a third part. For protecting the conductive layers from moisture, each of the areas of the conductive layers corresponding to the second part is smaller than the area of the first cap-insulation layer corresponding to the second part for at least a first predetermined percentage, and each of the areas of the conductive layers corresponding to the second part is smaller than the area of the second cap-insulation layer corresponding to the second part for at least the first predetermined percentage.

19 Claims, 5 Drawing Sheets

10,004,137 B2

PRINTED CIRCUIT BOARD ASSEMBLY

CROSS REFERENCE TO RELATED APPLICATIONS

This application claims priority of Taiwan Patent Application No. 105108770, filed on Mar. 22, 2016, the entirety of which is incorporated by reference herein.

BACKGROUND OF THE INVENTION

Field of the Invention

The present invention is related to a printed circuit board assembly, in particular to a printed circuit board assembly capable of resisting moisture.

Description of the Related Art

As technology advances, electronic components are expected to have better efficiency and performance, be smaller in size, and have better resistance to heat under different environments. Particularly in temperatures that are too high or too low, electronic components can often get damaged, causing these electronic components to malfunction. Therefore, most electronic components go through various environmental simulations to check their performance before being put onto the market. For example, using present technology, designers and manufacturers can use a temperature test chamber's test device to simulate various temperatures and observe the performance of the electronic components under different temperatures.

While being tested, the electronic component waiting to be tested connects to a printed circuit board which communicates with the temperature test chamber's test device host. In other words, the printed circuit board connecting to the electronic component and the host is partly inside the temperature test chamber and partly outside the temperature test chamber, and therefore the two parts are under different temperatures. This in turn causes a conductive layer that forms when the temperature goes below zero and forms frost that causes humidity to damage the printed circuit board.

BRIEF SUMMARY OF THE INVENTION

A detailed description is given in the following embodiments with reference to the accompanying drawings.

An exemplary embodiment provides a printed circuit board assembly including a substrate. The substrate includes a first cap-insulation layer, a second cap-insulation layer and a plurality of conductive layers. The conductive layers are vertically sandwiched between the first cap-insulation layer and the second cap-insulation layer, wherein the substrate has a first part, a second part and a third part, and the second part is laterally sandwiched between the first part and the third part along a longitudinal direction, wherein for protecting the conductive layers from moisture, each of the areas of the conductive layers corresponding to the second part is smaller than the area of the first cap-insulation layer corresponding to the second part for at least a first predetermined percentage, and each of the areas of the conductive layers corresponding to the second part is smaller than the area of the second cap-insulation layer corresponding to the second part for at least the first predetermined percentage.

Another exemplary embodiment provides a printed circuit board assembly including a substrate. The substrate includes a first cap-insulation layer, a second cap-insulation layer and a plurality of conductive layers. The conductive layers are vertically sandwiched between the first cap-insulation layer and the second cap-insulation layer, wherein the substrate has a first part, a second part and a third part, the second part is laterally sandwiched between the first part and the third part along a longitudinal direction, wherein for protecting the conductive layers from moisture, the sides of each of the conductive layers that correspond to the second part and are vertical to the longitudinal direction has a distance that is greater than a first predetermined distance from the sides of the first cap-insulation layer and the second cap-insulation layer that corresponds to the second part and verticals to the longitudinal direction.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
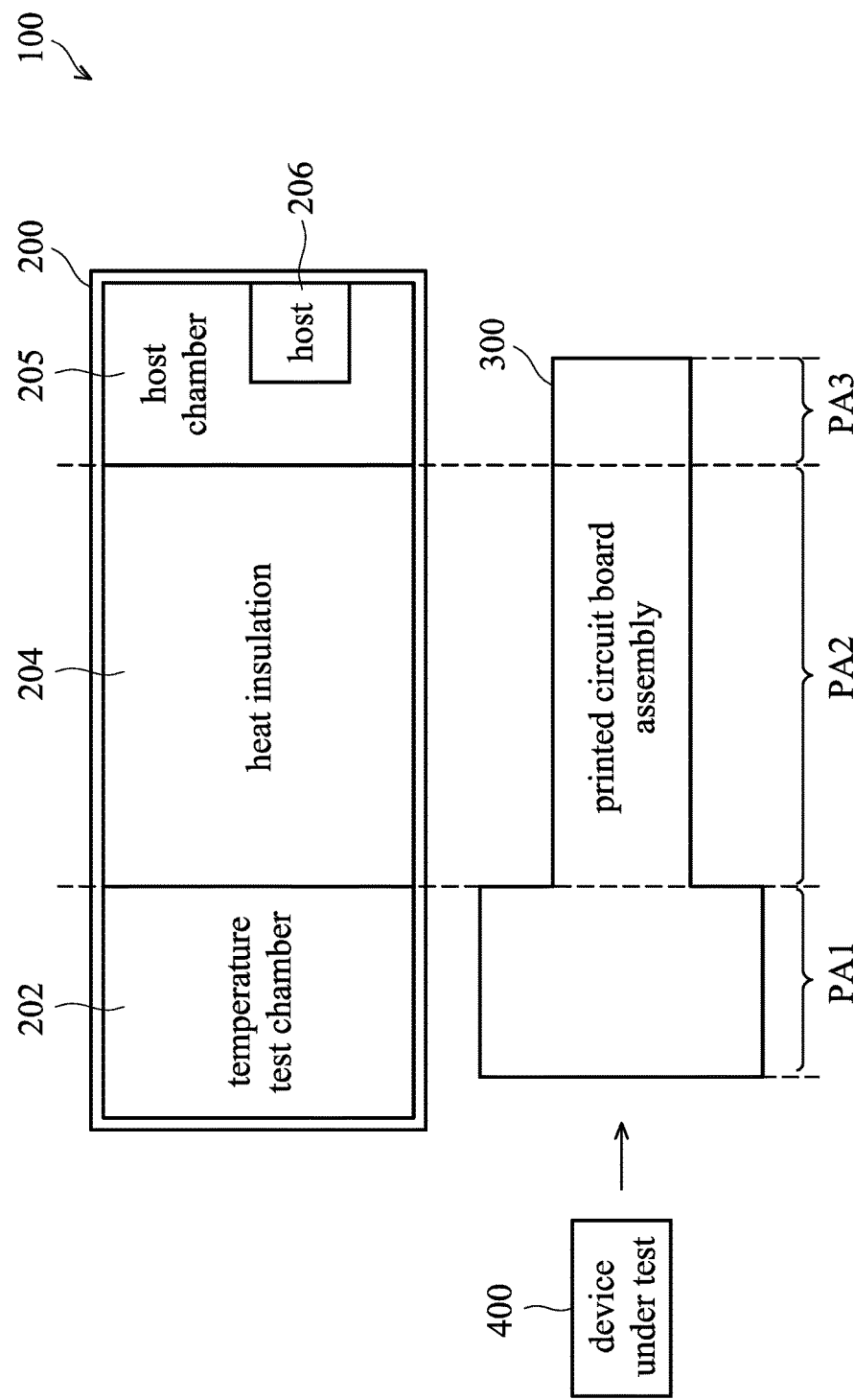
FIG. 1 is a schematic diagram illustrating a test system in accordance with some embodiments.

FIG. 1 is a schematic diagram illustrating a test system in accordance with some embodiments. The test system 100 includes a test device 200, a printed circuit board assembly 300 and a device under test 400. The test device 200 includes a temperature test chamber 202, a heat insulation 204 and a host chamber 205. The temperature test chamber 202 is arranged to simulate various temperatures. Namely, the test device 200 is arranged to control the temperature in the temperature test chamber 202 by temperature adjusting device (not shown) for testing the device under test 400 under specific temperature. The heat insulation 204 is between the temperature test chamber 202 and the host chamber 205, and arranged to isolate the temperature of the temperature test chamber 202 from the ambient temperature of the host chamber 205. The host chamber 205 includes a host 206 arranged to be coupled with the device under test 400 of the temperature test chamber 202 in order to control the device under test 400, communicate with the device under test 400, read data from the device under test 400 and/or control the temperature of the temperature test chamber. The printed circuit board assembly 300 carries the device under test 400 in order to contain the device under test 400 in the temperature test chamber 202 of the test device 200 and connect the device under test 400 to the host 206 through the heat insulation 204. The portion of printed circuit board assembly 300 that is arranged to be placed in the temperature test chamber 202 is the first part PA1, the portion of the printed circuit board assembly 300 that is arranged to be placed in the heat insulation 204 is the second part PA2, and the portion of printed circuit board assembly 300 that is arranged to be placed in the host chamber 205 is the third part PA3. The details of the printed circuit board assembly 300 can be referred to in FIG. 2. Moreover, in one embodiment, the device under test 400 can be a Solid State Disk (SSD), but it is not limited thereto. In other embodiments, the device under test 400 can be various processors, sensors, displays, etc.

Figure 2:
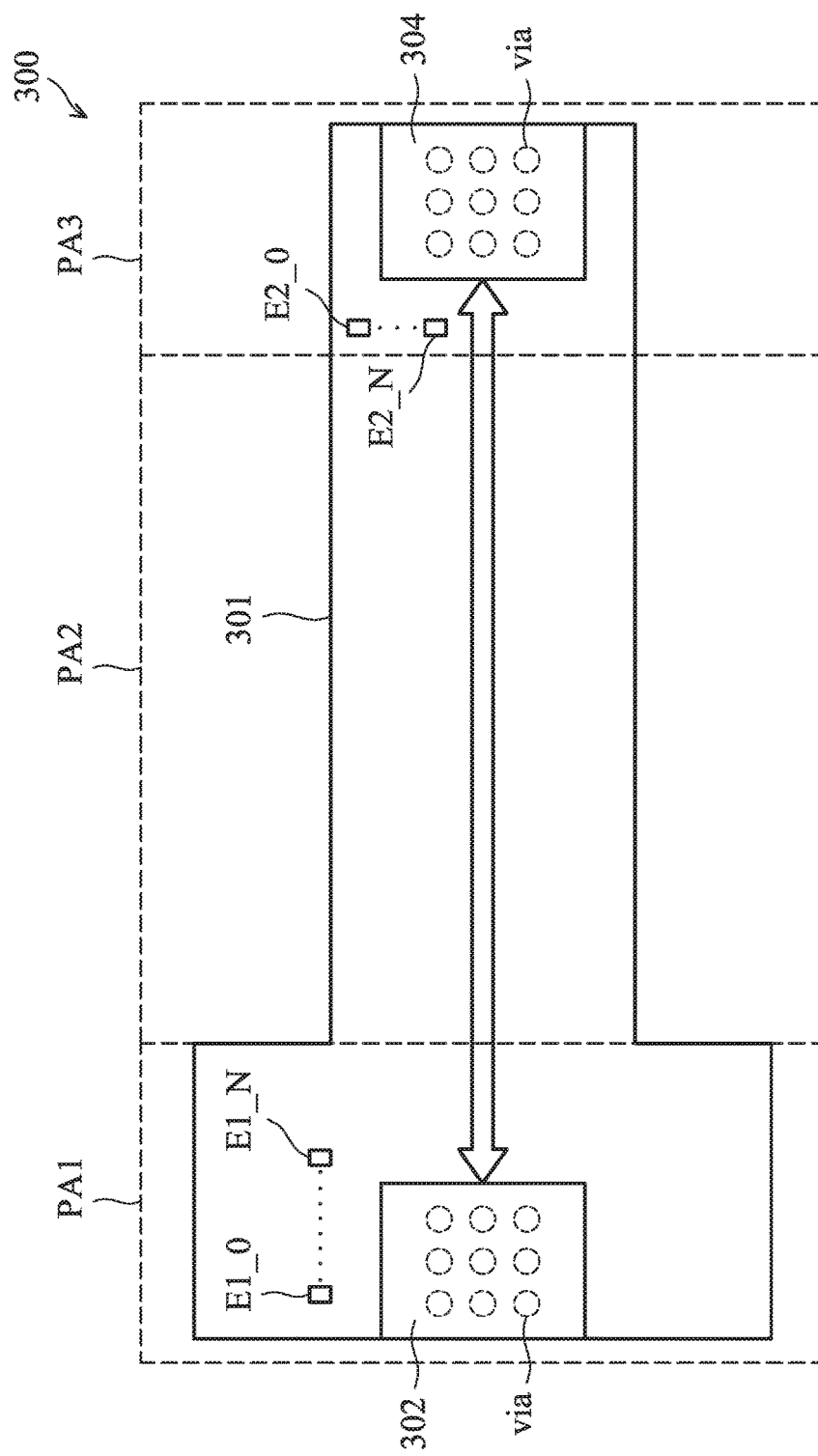
FIG. 2 is a schematic diagram illustrating a printed circuit board assembly in accordance with some embodiments.

FIG. 2 is a schematic diagram illustrating a printed circuit board assembly in accordance with some embodiments. The printed circuit board assembly 300 includes a substrate 301, a first connector 302 and a second connector 304.

The substrate 301 is arranged to carry the first connector 302, the second connector 304, the electronic component E1_0~E1_N and the electronic component E2_0~E2_N in order to couple the first connector 302, the second connector 304, the electronic component E1_0~E1_N and the electronic component E2_0~E2_N with each other. Moreover, the substrate 301 has a first part PA1, a second part PA2 and a third part PA3, wherein the second part PA2 is laterally sandwiched between the first part PA1 and the third part PA3 along the longitudinal direction. More specifically, during the test process, the portion of the substrate 301 that is placed in the temperature test chamber is the first part PA1, the portion of the substrate 301 that is placed in the heat insulation 204 is the second part PA2, and the portion of the substrate 301 that is placed in the host chamber 205 is the third part PA3. It should be noted that the first part PA1, the second part PA2 and the third part PA3 are regions defined for demonstrating the functions and placements of the substrate 301, however, in reality, substrate 301 is in one piece. In this embodiment, the width of the first part PA1 is greater than the width of the second part PA2 and the width of the third part PA3, but it is not limited thereto. In other embodiments, the shapes of the first part PA1, the second part PA2 and the third part PA3 of the substrate 301 may be different according to the model or structure of the test device 200. For example, the widths of the first part PA1, the second part PA2 and the third part PA3 of the substrate 301 can be the same, but it is not limited thereto. Moreover, in this embodiment, the first part PA1, the second part PA2 and the third part PA3 are quadrilateral. In other embodiments, the first part PA1, the second part PA2 and the third part PA3 can be polygons of different sizes and shapes, but it is not limited thereto. Moreover, the substrate 301 has a plurality of vias (as depicted by the dotted circle in FIG. 2) disposed under the first connector 302 and the second connector 304.

The first connector 302 is implemented on the first part PA1 of the substrate 301 and coupled to the device under test 400. During the test process, the first part PA1 of the substrate 301 will be placed into the temperature test chamber, such that the device under test 400 coupled to the first connector 302 can be under a specific temperature. In one embodiment, the peripheral of the substrate 301 may include at least one electronic component E1_0~E1_N arranged to be coupled to the first connector 302 for providing an electrical function for the first connector 302. For example, the electronic components E1_0~E1_N can be diodes, transistors, resistors and/or capacitors, etc. However, in other embodiments, the peripheral of the first connector 302 can also include no electronic components.

The second connector 304 is implemented in the third part PA3 of the substrate 301 and coupled to the host 206, in which the first connector 302 implanted in the first part PA1 is electrically connected to the second connector 304 implemented in the third part PA3 through the second part PA2 by the lines patterned on the substrate 301, such that the host 206 can be coupled to the first connector 302 implemented in the first part by the second connector 304 implemented on the third part of the substrate 301 for controlling the device under test 400. In one embodiment, the peripheral of the second connector 304 of the substrate 301 may include at least one electronic component E2_0~E2_N arranged to be coupled to the second connector 304 for providing an electrical function for the second connector 304. For example, the electronic components E2_0~E2_N can be diodes, transistors, resistors and/or capacitors, etc. However, in other embodiments, the peripherals of the second connector 304 can also include no electronic components.

Figure 3:
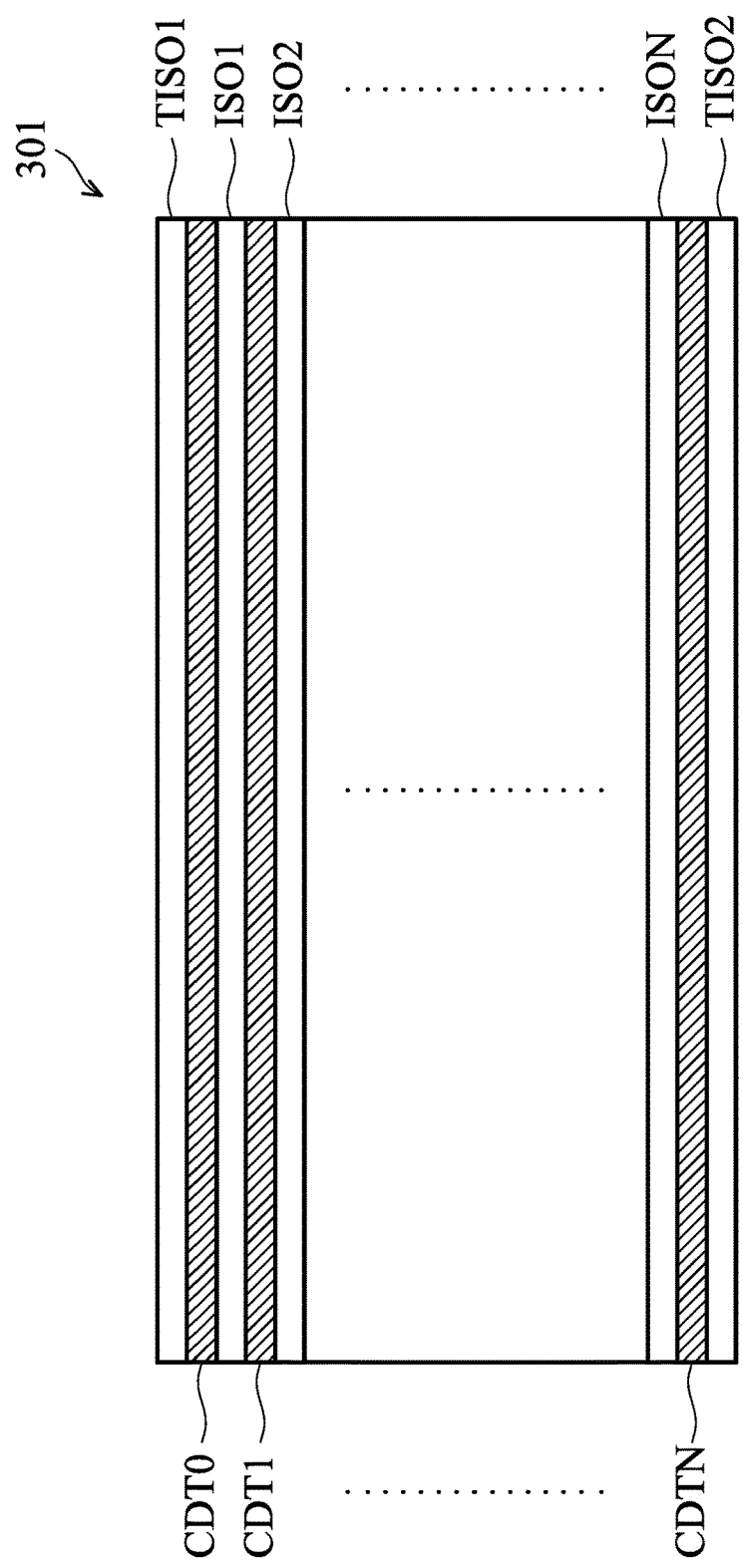
FIG. 3 is a lateral view of a substrate in accordance with some embodiments.

FIG. 3 is a lateral view of a substrate in accordance with some embodiments. The substrate 301 includes a first cap-insulation layer TISO1, a second cap-insulation layer TISO2, a plurality of conductive layers CDT0~CDTN and a plurality of insulators ISO1~ISON.

The substrate 301 is a laminated board made of an insulating material such as plastic which contains a plurality of conductive layers CDT0~CDT_N of metal such as copper separated by insulators ISO1~ISON, but it is not limited thereto. The conductive layers CDT0~CDT_N can be made of other conductive materials except for copper. The conductive layers CDT0~CDT_N are used for electrical connecting the elements on the substrate 301, conducting heat and/or grounding, etc.

For forming multilayer wiring structure, the conductive layers CDT0~CDTN are vertically sandwiched between the first cap-insulation layer TISO1 and the second cap-insulation layer TISO2, and the conductive layers CDT0~CDTN are further isolated from each other by the insulators ISO1~ISON.

It should be noted that, in this embodiment, the outermost insulation is the cap-insulation layer, such as the first cap-insulation layer TISO1 and the second cap-insulation layer TISO2. In this embodiment, first cap-insulation layer TISO1 and the second cap-insulation layer TISO2 do not have external conductive layers on the outside, but it is not limited thereto. In other embodiments, the first cap-insulation layer TISO1 and/or the second cap-insulation layer TISO2 may have external patterned lines or a conductive layer on the outside.

Figure 4:
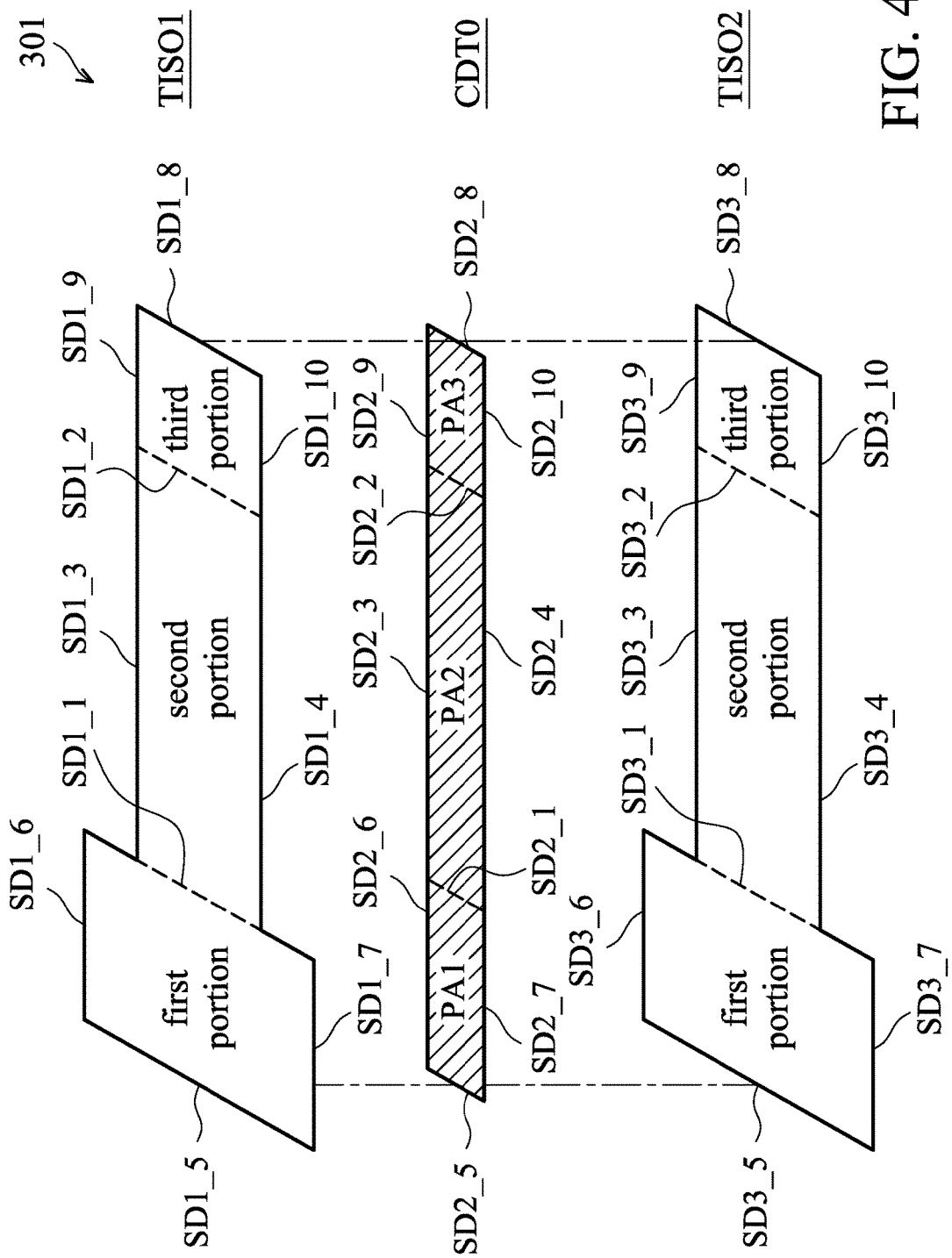
FIG. 4 is an exploded view of a substrate in accordance with some embodiments.

FIG. 4 is an exploded view of a substrate in accordance with some embodiments, in which the substrate 301 of FIG. 4 is a single layer structure, but it is not limited thereto. Namely, in this embodiment, the substrate 301 only has one first cap-insulation layer TISO1, one second cap-insulation layer TISO2 and one conductive layer CDT0.

As described above, the substrate 301 has a first part PA1, a second part PA2 and a third part PA3, wherein the second part PA2 is laterally sandwiched between the first part PA1 and the third part PA3 along a longitudinal direction.

More specifically, in the exploded view, each of the first cap-insulation layer TISO1, the second cap-insulation layer TISO2 and the conductive layer CDT0 of the substrate 301 has the first part PA1, the second part PA2 and the third part PA3. The first cap-insulation layer TISO1 corresponding to the first part PA1 has four sides SD1_1, SD1_5, SD1_6 and SD1_7. The second part PA2 of the first cap-insulation layer TISO1 has four sides SD1_1, SD1_2, SD1_3 and SD1_4. The third part PA3 of the first cap-insulation layer TISO1 has four sides SD1_2, SD1_8, SD1_9 and SD1_10. It should be noted that, the side SD1_1 and the side SD1_2 are not physical divisions but are virtual compartments to distinguish first part PA1, second part PA2 and the third part PA3. The conductive layer CDT0 corresponding to the first part PA1 has four sides SD2_1, SD2_5, SD2_6 and SD2_7. The conductive layer CDT0 corresponding to the second part PA2 has four sides SD2_1, SD2_2, SD2_3 and SD2_4. The conductive layer CDT0 corresponding to the third part PA3 has four sides SD2_2, SD2_8, SD2_9 and SD2_10. It should be noted that the side SD2_1 and the side SD2_2 are not physical divisions but are virtual compartments to distinguish first part PA1, second part PA2 and the third part PA3. The first part PA1 of the second cap-insulation layer TISO2 corresponding to the first part PA1 has four sides SD3_1, SD3_5, SD3_6 and SD3_7. The second cap-insulation layer TISO2 corresponding to the second part PA2 has four sides SD3_1, SD3_2, SD3_3 and SD3_4. The second cap-insulation layer TISO2 corresponding to the third part PA3 has four sides SD3_2, SD3_8, SD3_9 and SD3_10. It should be noted that the side SD3_1 and the side SD3_2 are not physical divisions but are virtual compartments to distinguish first part PA1, second part PA2 and the third part PA3.

Figure 5:
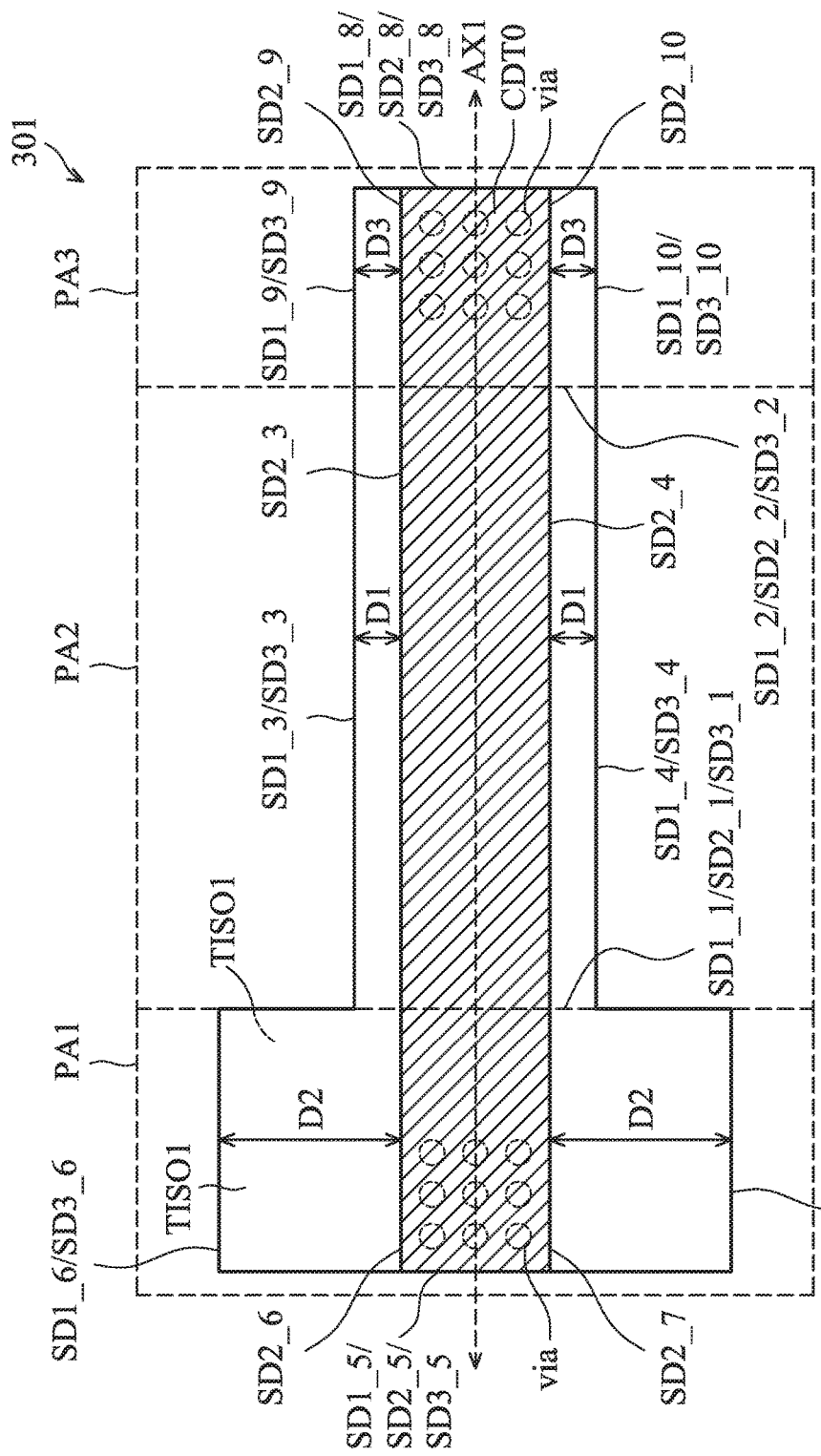
FIG. 5 is a plan view of a substrate in accordance with some embodiments.

FIG. 5 is a plan view of a substrate in accordance with some embodiments. FIG. 5 is a birds-eye-view of the compilation of the parts of FIG. 4. It should be noted that FIG. 5 further includes a reference axis AX1 to better clarify, wherein the reference axis AX1 is parallel to the longitudinal direction, and the distances from the reference axis AX1 to the side SD2_3 and to the SD2_4 are the same.

In one embodiment, each of the side SD2_3 and the side SD2_4 which are corresponding to the second part PA2 and parallel to the longitudinal direction of the conductive layer CDT0 has a distance of at least a first predetermined distance D1 from the sides SD1_3/SD3_3 and SD1_4/SD3_4 which are corresponding to the second part PA2 and parallel to the longitudinal direction of the first cap-insulation layer TISO1 and the second cap-insulation layer TISO2 in order to protect the conductive layer from moisture. More specifically, the side SD2_3 on a side of the reference axis AX1 has a distance of at least a first predetermined distance D1 from the sides SD1_3/SD3_3, and the side SD2_4 on another side of the reference axis AX1 has a distance of at least a first predetermined distance D1 from the sides SD1_4/SD3_4, but it is not limited thereto.

In other embodiments, the sides of each of the conductive layers CDT0~CDTN that are corresponding to the second part PA2 and vertical to the longitudinal direction have distances of at least a first predetermined distance D1 from the sides SD1_3/SD3_3 and SD1_4/SD3_4 of the first cap-insulation layer TISO1 and the second cap-insulation layer TISO2 that are corresponding to the second part PA2 and vertical to the longitudinal direction. In another embodiment, the sides of each of the conductive layers CDT0~CDTN that are corresponding to the second part PA2 and vertical to the longitudinal direction have distances of at least a first predetermined distance D1 from the sides of the first cap-insulation layer TISO1, the second cap-insulation layer TISO2 and the insulation ISO1~ISON that are corresponding to the second part PA2 and vertical to the longitudinal direction.

In one embodiment, for protecting the conductive layer from moisture, the side SD2_6 and the side SD2_7 of the conductive layer CDT0 that corresponds to the first part PA1 and is vertical to the longitudinal direction have a distance that is greater than the second predetermined distance D2 from the sides SD1_6/SD3_6 and SD1_7/SD3_7 of the first cap-insulation layer TISO1 and the second cap-insulation layer TISO2 that correspond to the second part PA2 and are vertical to the longitudinal direction, such that moisture cannot enter the conductive layers. More specifically, the side SD2_6 on one side of the reference axis AX1 has at least a first predetermined distance D1 from the sides SD1_6/SD3_6, and the side SD2_7 on the other side of the reference axis AX1 has at least a first predetermined distance D1 from the sides SD1_7/SD3_7, but it is not limited thereto.

In other embodiments, the sides of each of the conductive layers CDT0~CDTN that corresponds to the first part PA1 and is vertical to the longitudinal direction has at least second predetermined distance D2 from the sides SD1_6/SD3_6 and SD1_7/SD3_7 of the first cap-insulation layer TISO1 and the second cap-insulation layer TISO2 that corresponds to the first part PA1 and are vertical to the longitudinal direction. In yet another embodiment, the sides of each of the conductive layers CDT0~CDTN that corresponds to the first part PA1 and is vertical to the longitudinal direction have distances of at least second predetermined distance D2 from the sides of the first cap-insulation layer TISO1, the second cap-insulation layer TISO2 and the insulation ISO1~ISON that correspond to the first part PA1 and is vertical to the longitudinal direction.

In one embodiment, the sides SD2_9 and SD2_10 of the conductive layer CDT0 that corresponds to the third part PA3 and is vertical to the longitudinal direction has a distance of at least a third predetermined distance D3 from the sides SD1_9/SD3_9 and SD1_10/SD3_10 of the first cap-insulation layer TISO1 and the second cap-insulation layer TISO2 that correspond to the third part PA3 and are vertical to the longitudinal direction, such that the conductive layers are protected from moisture. More specifically, the side SD2_9 on one side of the reference axis AX1 has a distance of at least the third predetermined distance D3 from the sides SD1_9/SD3_9, and the side SD2_10 on the other side of the reference axis AX1 has a distance of at least the third predetermined distance D3 from the sides SD1_10/SD3_10, but it is not limited thereto.

In other embodiments, the sides of each of the conductive layers CDT0~CDTN that correspond to the third part PA3 and are vertical to the longitudinal direction have distances of at least one third predetermined distance D3 from the sides SD1_9/SD3_9 and SD1_10/SD3_10 of the first cap-insulation layer TISO1 and the second cap-insulation layer TISO2 that correspond to the third part PA3 and are vertical to the longitudinal direction. In yet another embodiment, the sides of each of the conductive layers CDT0~CDTN that correspond to the third part PA3 and are vertical to the longitudinal direction have a distance of at least the third predetermined distance D3 from the sides of the first cap-insulation layer TISO1, the second cap-insulation layer TISO2 and the insulators ISO1~ISON that correspond to the first part PA1 and are vertical to the longitudinal direction.

In some embodiments, the first predetermined distance D1, the second predetermined distance D2 and the third predetermined distance D3 are greater than 0.5 cm, but it is not limited thereto. In another embodiment, the first predetermined distance D1, the second predetermined distance D2 and the third predetermined distance D3 are greater than 1 cm, but it is not limited thereto. In this embodiment, the first predetermined distance D1 and the third predetermined distance D3 are the same, and the second predetermined distance D2 is greater than the first predetermined distance D1 and the third predetermined distance D3, but it is not limited thereto. The first predetermined distance D1, the second predetermined distance D2 and the third predetermined distance D3 may change based on the shape of substrate 301, but all of the first predetermined distance D1, the second predetermined distance D2 and the third predetermined distance D3 are greater than 0.5 cm or 1 cm.

In yet another embodiment, the lengths of the sides (such as SD1_5) of the conductive layers CDT_0~CDT_N that are corresponding to the first part PA1 and vertical to the longitudinal direction are the same as the length of the first connector 302, and the lengths of the sides (such as SD1_8) of the conductive layers CDT_0~CDT_N that are corresponding to the third part PA3 and vertical to the longitudinal direction are the same as the length of the second connector 304. It should be noted that, in this embodiment, the first predetermined distance D1, the second predetermined distance D2 and the third predetermined distance D3 are greater than 0.5 cm or 1 cm.

In another embodiment, the area of the each of the conductive layers CDT0~CDTN corresponding to the second part PA2 is smaller than the area of the first cap-insulation layer TISO1 corresponding to the second part PA2 for at least a first predetermined percentage, and the area of each of the conductive layers CDT0~CDTN corresponding to the second part PA2 is smaller than the area of the second cap-insulation layer TISO2 corresponding to the second part PA2 for at least a first predetermined percentage. In yet another embodiment, for preventing moisture from getting into the conductive layers CDT0~CDTN, the area of each of the conductive layers CDT0~CDTN corresponding to the first part PA1 is smaller than the area of first cap-insulation layer TISO1 corresponding to the first part PA1 for a second predetermined percentage, and the area of each of the conductive layers CDT0~CDTN corresponding to the first part PA1 is smaller than the area of the second cap-insulation layer TISO2 corresponding to the first part PA1 for the second predetermined percentage. In yet another embodiment, for preventing moisture from getting into the conductive layers CDT0~CDTN, the area of each of the conductive layers CDT0~CDTN corresponding to the third part PA3 is smaller than the area of the first cap-insulation layer TISO1 corresponding to the third part PA3 for a third predetermined percentage, and area of each of the conductive layers CDT0~CDTN corresponding to the third part PA3 is smaller than the area of the second cap-insulation layer TISO2 corresponding to the third part PA3 for the third predetermined percentage. It should be noted that the above embodiments can be combined in various way and implemented on the substrate 301.

In another embodiment, the area of each of the conductive layers CDT0~CDTN corresponding to the second part PA2 is smaller than the area of the first cap-insulation layer TISO1, the second cap-insulation layer TISO2 and the insulation ISO1~ISON that correspond to the second part PA2 for at least a first predetermined percentage. In yet another embodiment, the area of each of the conductive layers CDT0~CDTN corresponding to the first part PA1 is smaller than the area of each of the first cap-insulation layer TISO1, the second cap-insulation layer TISO2 and the insulators ISO1~ISON which correspond to the first part PA1 for a second predetermined percentage. In yet another embodiment, the area of each of the conductive layers CDT0~CDTN corresponding to the third part PA3 is smaller than the area of each of the first cap-insulation layer TISO1, the second cap-insulation layer TISO2 and the insulation ISO1~ISON which are corresponding to the third part PA3 for a third predetermined percentage. It should be noted that the above embodiments can be combined in various ways and implemented on the substrate 301

In one embodiment, the first predetermined percentage, the second predetermined percentage and the third predetermined percentage can be 5%, 10% or 20%, but it is not limited thereto.

Moreover, the conductive layers CDT0~CDTN are electrically connected with each other by the vias on the substrate. Generally, the vias disperse through layers. The vias on the topmost insulation or bottommost insulation, that is the first cap-insulation layer TISO1 and the second cap-insulation layer TISO2, will connect with the ambient environment, such that moisture will get into the conductive layers through the vias on the first cap-insulation layer TISO1 and the second cap-insulation layer TISO2. In view of this, one of the embodiments of the present invention changes/designs the density and the positions of the vias on the first cap-insulation layer TISO1 and the second cap-insulation layer TISO2 to avoid moisture getting into the conductive layers by the vias. As illustrated in FIG. 5, the first cap-insulation layer TISO1 has a plurality of vias (as depicted by the dotted circle) disposed on different position.

More specifically, the region under the first connector 302 is a first region, the region under the second connector 304 is a second region, and the region of the first part PA1, the second part PA2 and the third part PA3 except for the first region and the second region is a third region. In one embodiment, the density of the vias on the second region of the first cap-insulation layer TISO1 and the second cap-insulation layer TISO2 is greater than the density of vias on the third region of the first cap-insulation layer TISO1 and the second cap-insulation layer TISO2. In another embodiment, the density of vias on the first region of the first cap-insulation layer TISO1 and the second cap-insulation layer TISO2 is greater than the density of vias on the third region of the first cap-insulation layer TISO1 and the second cap-insulation layer TISO2. More specifically, in the above embodiment, the first connector 302 and the second connector 304 respectively cover the vias on the first region and the second region of the first cap-insulation layer TISO1 and the second cap-insulation layer TISO2, such that the exposed vias are reduced. Therefore, the amount of moisture that gets into the layers by the exposed vias is also reduced.

In yet another embodiment, the first cap-insulation layer TISO1 and the second cap-insulation layer TISO2 corresponding to the third region do not have any vias. More specifically, in the above embodiment, the first connector 302 and the second connector 304 cover all of the vias on the first region and the second region of the first cap-insulation layer TISO1 and the second cap-insulation layer TISO2, such that there is no exposed via on the first cap-insulation layer TISO1 and the second cap-insulation layer TISO2. Therefore, moisture cannot get into the conductive layers through the exposed vias.

Moreover, in another embodiment, the substrate 301 corresponding to the second part of the first cap-insulation layer TISO1 and the second cap-insulation layer TISO2 can be wrapped in electrical tape to create water resistance.

As described above, the printed circuit board assembly 300 can reduce the amount of moisture that is caused by the temperature difference that gets into the conductive layers.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board assembly, comprising:
a substrate, comprising:
a first cap-insulation layer;
a second cap-insulation layer;
a plurality of conductive layers, vertically sandwiched between the first cap-insulation layer and the second cap-insulation layer, wherein the substrate has a first part, a second part and a third part, and the second part is laterally sandwiched between the first part and the third part along a longitudinal direction, wherein for protecting the conductive layers from moisture, each of the areas of the conductive layers corresponding to the second part is smaller than the area of the first cap-insulation layer corresponding to the second part for at least a first predetermined percentage, and each of the areas of the conductive layers corresponding to the second part is smaller than the area of the second cap-insulation layer corresponding to the second part for at least the first predetermined percentage;
a first connector implemented in the first part; and
a second connector implemented in the third part, wherein the first cap-insulation layer and the second cap-insulation layer has a plurality of vias, wherein the region under the first connector is a first region, the region under the second connector is a second region, and the region except for the first region and the second region in the first part, the second part and the third part is a third region, wherein density of the vias on the first cap-insulation layer corresponding to the second region and density of vias on the second cap-insulation layer corresponding to the second region are larger than density of the vias on the first cap-insulation layer corresponding to the third region and density of vias on the second cap-insulation layer corresponding to the third region.

2. The printed circuit board assembly as claimed in claim 1, wherein each of the areas of the conductive layers corresponding to the first part is smaller than the area of the first cap-insulation layer corresponding to the first part for at least a second predetermined percentage, each of the areas of the conductive layers corresponding to the first part is smaller than the area of the second cap-insulation layer corresponding to the first part for at least the second predetermined percentage, each of the areas of the conductive layers corresponding to the third part is smaller than the area of the first cap-insulation layer corresponding to the third part for at least the third predetermined percentage, and each of the areas of the conductive layers corresponding to the third part is smaller than the area of the second cap-insulation layer corresponding to the third part for at least the third predetermined percentage.

3. The printed circuit board assembly as claimed in claim 2, wherein the first predetermined percentage, the second predetermined percentage and the third predetermined percentage are each ten percent.

4. The printed circuit board assembly as claimed in claim 1, wherein
the first connector is coupled to a device under test; and
the second connector is coupled to a host.

5. The printed circuit board assembly as claimed in claim wherein density of the vias on the first cap-insulation layer corresponding to the first region and the density of the vias on the second cap-insulation layer corresponding to the first region are larger than density of the vias on the first cap-insulation layer corresponding to the third region and density of the vias on the second cap-insulation layer corresponding to the third region.

6. The printed circuit board assembly as claimed in claim 5, wherein the first connector and the second connector cover the vias on the first cap-insulation layer and the second cap-insulation layer corresponding to the first region and the second region.

7. The printed circuit board assembly as claimed in claim 1, wherein the first cap-insulation layer corresponding to the third region and the second cap-insulation layer corresponding to the third region do not have any vias.

8. A printed circuit board assembly, comprising:
a substrate, comprising:
a first cap-insulation layer;
a second cap-insulation layer; and
a plurality of conductive layers, vertically sandwiched between the first cap-insulation layer and the second cap-insulation layer, wherein the substrate has a first part, a second part and a third part, the second part is laterally sandwiched between the first part and the third part along a longitudinal direction, wherein for protecting the conductive layers from moisture, sides of each of the conductive layers that corresponds to the second part and is vertical to the longitudinal direction has a distance that is greater than a first predetermined distance from sides of the first cap-insulation layer and the second cap-insulation layer that corresponds to the second part and is vertical to the longitudinal direction, wherein the first predetermined distance is more than 0.5 cm.

9. The printed circuit board assembly as claimed in claim 8, wherein sides of each of conductive layers that corresponds to the first part and verticals to the longitudinal direction has a distance that is greater than a second predetermined distance from sides of the first cap-insulation layer and the second cap-insulation layer that corresponds to the first part and verticals to the longitudinal direction, and sides of each of the conductive layers that corresponds to the third part and vertical to the longitudinal direction have a distance that is greater than a third predetermined distance from sides of the first cap-insulation layer and the second cap-insulation layer that corresponds to the third part and verticals to the longitudinal direction.

10. The printed circuit board assembly as claimed in claim 9, wherein the second predetermined distance and the third predetermined distance are more than 0.5 cm.

11. The printed circuit board assembly as claimed in claim 8, further comprising: a first connector, implemented in the first part and coupled to a device under test; and
a second connector, implemented in the third part and coupled to a host, wherein the first cap-insulation layer and the second cap-insulation layer have a plurality of vias, wherein the region under the first connector is a first region, the region under the second connector is a second region, and the region except for the first region and the second region in the first part, the second part and the third part is a third region.

12. The printed circuit board assembly as claimed in claim 11, wherein density of the vias on the first cap-insulation layer corresponding to the second region and density of vias on the second cap-insulation layer corresponding to the second region are larger than density of the vias on the first cap-insulation layer corresponding to the third region and density of vias on the second cap-insulation layer corresponding to the third region.

13. The printed circuit board assembly as claimed in claim 12, wherein density of the vias on the first cap-insulation layer corresponding to the first region and the density of the vias on the second cap-insulation layer corresponding to the first region are larger than density of the vias on the first cap-insulation layer corresponding to the third region and density of the vias on the second cap-insulation layer corresponding to the third region.

14. The printed circuit board assembly as claimed in claim 13, wherein the first connector and the second connector cover all of the vias on the first cap-insulation layer and the second cap-insulation layer corresponding to the first region and the second region.

15. The printed circuit board assembly as claimed in claim 11, wherein the first cap-insulation layer corresponding to the third region and the second cap-insulation layer corresponding to the third region do not have any vias.

16. A printed circuit board assembly, comprising:
a substrate, comprising:
a first cap-insulation layer;
a second cap-insulation layer, wherein the first cap-insulation layer and the second cap-insulation layer have a plurality of vias; and
a plurality of conductive layers, vertically sandwiched between the first cap-insulation layer and the second cap-insulation layer, wherein the substrate has a first part, a second part and a third part, the second part is laterally sandwiched between the first part and the third part along a longitudinal direction;
a first connector, implemented in the first part and coupled to a device under test, wherein a region under the first connector is a first region; and
a second connector, implemented in the third part and coupled to a host, wherein a region under the second connector is a second region, a region in the first part, the second part and the third part except for the first region and the second region is a third region, and density of the vias on the first cap-insulation layer corresponding to the second region and the second cap-insulation layer corresponding to the second region is larger than density of vias on the first cap-insulation layer corresponding to the third region and the second cap-insulation layer corresponding to the third region.

17. The printed circuit board assembly as claimed in claim 16, wherein density of the vias on the first cap-insulation layer corresponding to the first region and the second cap-insulation layer corresponding to the first region is larger than density of the vias on the first cap-insulation layer corresponding to the third region and the second cap-insulation layer corresponding to the third region.

18. The printed circuit board assembly as claimed in claim 17, wherein the first connector and the second connector cover the vias on the first cap-insulation layer and the second cap-insulation layer corresponding to the first region and the second region.

19. The printed circuit board assembly as claimed in claim 16, wherein the first cap-insulation layer corresponding to the third region and the second cap-insulation layer corresponding to the third region do not have any vias.

* * * * *